United States Patent [19]
Fujii

[11] Patent Number: 5,739,712
[45] Date of Patent: Apr. 14, 1998

[54] POWER AMPLIFYING CIRCUIT HAVING AN OVER-CURRENT PROTECTIVE FUNCTION

[75] Inventor: Takashi Fujii, Tokyo, Japan

[73] Assignee: NEC Corporation, Tokyo, Japan

[21] Appl. No.: 563,237

[22] Filed: Nov. 28, 1995

[30] Foreign Application Priority Data

Nov. 29, 1994 [JP] Japan ................................ 6-294857

[51] Int. Cl.⁶ ...................... H02H 9/02; H03L 5/00
[52] U.S. Cl. ................ 327/323; 327/78; 327/103; 327/328; 327/541; 361/100; 330/298
[58] Field of Search ...................... 327/72, 73, 77, 327/78, 80, 81, 103, 309, 312, 313, 323, 327, 328, 539, 541; 330/298, 207 P; 323/277, 279; 361/93, 100, 101, 115

[56] References Cited

U.S. PATENT DOCUMENTS

| | | | |
|---|---|---|---|
| 4,896,244 | 1/1990 | Kalina | 327/545 |
| 5,047,657 | 9/1991 | Seevinck et al. | 327/73 |
| 5,084,668 | 1/1992 | Kotowski et al. | 361/93 |
| 5,272,392 | 12/1993 | Wong et al. | 361/93 |
| 5,325,258 | 6/1994 | Choi et al. | 327/427 |
| 5,339,045 | 8/1994 | Rusnyak | 327/77 |
| 5,361,008 | 11/1994 | Saijo | 327/77 |
| 5,375,029 | 12/1994 | Fukunaga et al. | 361/93 |
| 5,428,287 | 6/1995 | Agiman | 361/101 |
| 5,519,310 | 5/1996 | Bartlett | 327/103 |
| 5,621,601 | 4/1997 | Fujihira et al. | 361/93 |

OTHER PUBLICATIONS

"Large Swing CMOS Power Amplifier," Kevin E. Brehmer et al., IEEE Journal of Solid–State Circuits, vol. SC–18, No. 6, Dec. 1983, pp. 624–628.

*Primary Examiner*—Timothy P. Callahan
*Assistant Examiner*—Terry L. Englund
*Attorney, Agent, or Firm*—Whitham, Curtis, Whitham & McGinn

[57] ABSTRACT

An amplifying circuit has an amplifying section including an operational amplifier for receiving an input signal and a power transistor for receiving the output of the operational amplifier to drive a load resistor. The amplifying circuit further has an over-current protective section including a current detection transistor receiving the output signal of the operational amplifier and a comparator comparing the output voltage of the current detection transistor and a reference voltage to supply a control signal to the operational amplifier when the output level representing the load current for the load resistor exceeds a threshold. The source of the power transistor and the source of the current detection transistor are maintained at the same potential by connecting both the sources or by providing a feedback section. A wide range of the voltage signal and an accurate threshold for the load current can be obtained.

14 Claims, 3 Drawing Sheets

POWER AMPLIFYING CIRCUIT HAVING AN OVER-CURRENT PROTECTIVE FUNCTION

BACKGROUND OF THE INVENTION (a) Field of the Invention

The present invention relates to a power amplifying circuit having an over-current protective function and, more particularly, to a power amplifying circuit having an over-current protective function suitable for use in CMOS LSIs.

(b) Description of Related Art

A power amplifying circuit for driving a low-resistance load usually includes an over-current protective function to prevent the amplifying circuit from being damaged by a overload current due to a short circuit of its output. FIG. 1 shows an example of a conventional power amplifying circuit in which a p-channel power transistor 3 in an output stage forms a common source configuration. In FIG. 1, an operational amplifier 2 and power transistor 3 constitute an amplifying section for driving a low-resistance load resistor 4, while a current detection resistor 5, a reference voltage source 6, and a comparator 7 constitute an over-current protective section.

Operational amplifier 2 has a circuit configuration shown in FIG. 2, in which operational amplifier 2 is composed of transistors Q1-Q7 and a constant current source I1. An input signal (IN) and a reference signal (REF) are supplied to the inverting input and non-inverting input connected to the gates of differential transistors Q2 and Q1, respectively, to generate an output signal (OUT) inverting the input signal at the drain of transistor Q2. The sources of the transistors Q1 and Q2 are connected together to the drain of a transistor Q3. The gate of transistor Q3 is supplied with a constant voltage generated by a serial circuit of a constant current source I1 and a load transistor Q4, which forms a first current mirror circuit together with transistor Q3. Transistors Q5 and Q6 forming a second current mirror circuit are connected between power supply line Vcc and the drains of transistors Q1 and Q2, respectively, to function as an active load. Also, the drain of a transistor Q7 is connected between the power supply line Vcc and the output terminal, while the gate of transistor Q7 is connected to a feedback terminal 20 for receiving a feedback signal (FB).

In operation of the amplifying circuit of FIG. 1, a voltage drop is produced across current detection resistor in proportion to the load current supplied from power transistor 3 to load resistor 4. The voltage signal is compared in comparator 7 with a reference voltage Vref supplied from the reference voltage source 6. When the load current exceeds a predetermined threshold, the voltage drop across current detection resistor 5 produces a voltage signal falling below the reference voltage Vref, so that the output of comparator 7 is reversed. As a result, the output of comparator 7 controls the operational amplifier 2 to raise the gate potential of power transistor 3, by turning transistor Q7 in FIG. 2 on, thereby stopping the load current of load resistor 4.

FIG. 3 shows another example of a conventional power amplifying circuit having an over-current protective function in which an n-channel power transistor 3 in an output stage forms a source follower configuration. In FIG. 3, a power transistor 3 and an operational amplifier 2 having a non-inverting input for receiving an input signal from input terminal 1 and an inverting input for receiving the source output of power transistor 3 forms an amplifying section for driving a load resistor 4. Comparator 7 and resistor 5 form an overcurrent protective circuit.

In operation, a voltage signal is generated by a voltage drop across current detection resistor 5 in proportion to the load current supplied from power transistor 3 to load resistor 4. The voltage signal thus generated is compared in a comparator 7 with a reference voltage Vref supplied from a reference voltage source 6. When the load current for the load resistor 4 exceeds a predetermined threshold, the voltage drop across current detection resistor 5 generates a voltage signal falling below the reference voltage Vref, so that the output of comparator 7 is reversed. As a result, operational amplifier 2A lowers the gate voltage of power transistor 3 to the ground potential so as to stop the load current.

Another conventional power amplifying circuit is shown in FIG. 4, in which a current detection transistor 8 is connected in parallel with power transistor 3, a current detect, ion resistor 5 being connected between the drain of current detection transistor 3 and a power supply line Vcc. The potential at the node connecting current detection resistor 5 and current detection transistor 3 is supplied to comparator 7, which compares the same with a reference voltage Vref. An operational amplifier 2A has a non-inverting input receiving an input signal, an inverting input receiving an output voltage across load resistor 4 and a control input receiving the output of comparator 7.

Those conventional over-current protective circuits described above have respective disadvantages as will be described later.

SUMMARY OF THE INVENTION

It is an object of the present invention to provide an improved power amplifying circuit having an over-current protective function in which the range of the output voltage of the amplifying circuit does not narrow even when a high load current is required, so that a wide range of the threshold voltage for detecting an over-current state can be obtained.

An amplifying circuit having an over-current protection function according to the present invention comprises an amplifying section including a first amplifier having an input terminal for receiving an input signal, an output terminal for supplying a first signal and a control terminal for receiving a control signal to control the signal level of said first signal, and a power transistor, having a gate, a source and a drain, for receiving said first signal at the gate thereof, for supplying a load current to a load of said amplifying circuit; and an over-current protective section including a current detection transistor, having a gate connected to the gate of said power transistor, a source and drain having potentials substantially equal to the potentials of the source and drain, respectively, of said power transistor, for receiving said first signal to supply a second signal, and a comparator receiving a third signal representing the magnitude of said second signal and a fourth signal having a constant voltage level, said comparator providing said control signal as the output thereof when said third signal exceeds said constant voltage level, said control signal controlling said load current to decrease.

In the power amplifying circuit according to the present invention, the output voltage for detecting the over-current state of the output of the power transistor does not decrease even when a load current increases. Accordingly, a wide range of the threshold voltage for detecting the over-current state can be guaranteed at any time, i.e., even when a high load current is required.

BRIEF DESCRIPTION OF THE DRAWINGS

The above and other objects, features and advantages of the present invention will be more apparent from the following description, referring to the accompanying drawings in which.

DESCRIPTION OF THE PREFERRED EMBODIMENTS

Before describing embodiments of the present invention, disadvantages of the conventional amplifying circuits will be described first for the sake of understanding of the advantages of the present invention.

Figure 1:
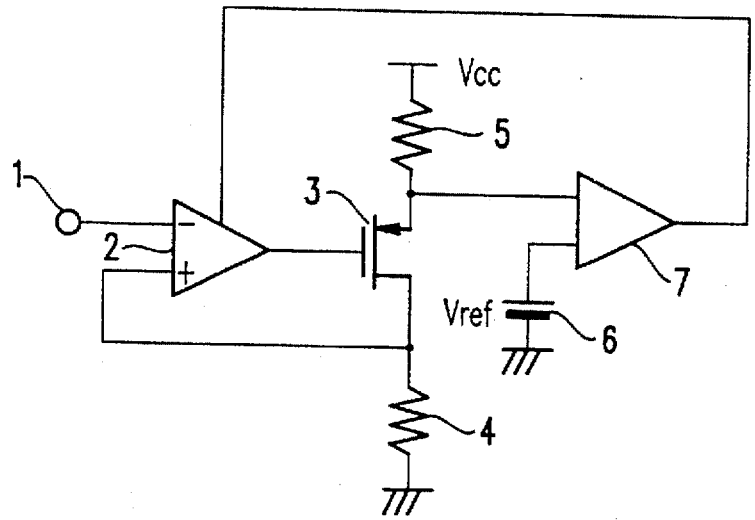
FIG. 1 is a circuit diagram showing a conventional amplifying circuit having an over-current protective function.

It is assumed in the circuit shown in FIG. 1 that load current is being supplied to load resistor 4 through power transistor 3 in a normal state. In such a state, the source voltage of power transistor 3 decreases by an amount corresponding to the voltage drop across current detection resistor 5. Since the output voltage of a common source transistor never exceeds the source voltage thereof in general, the output voltage supplied to load resistor 4 ranges only within the source voltage thereof if the input voltage supplied to power transistor 3 increases up to the vicinity of the supply voltage. In other words, the over-current protective section shown in FIG. 1 has a disadvantage in that the range of the voltage signal narrows by an amount corresponding to the voltage drop across current detection resistor 5.

Figure 3:
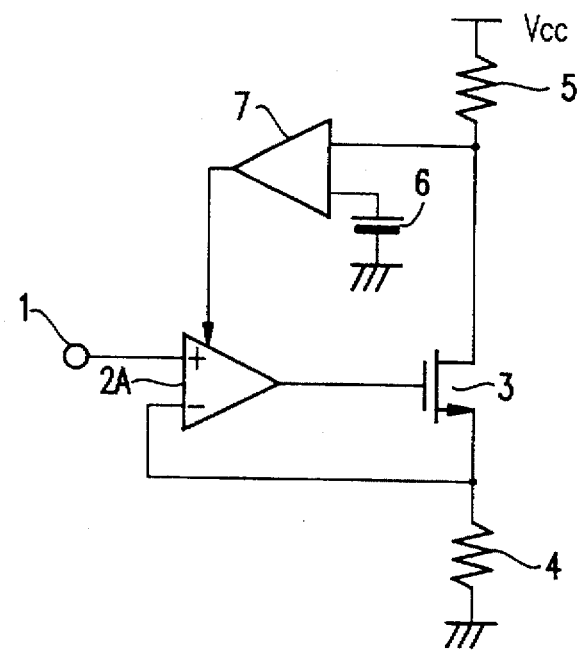
FIG. 3 is a circuit diagram showing another conventional amplifying circuit having an over-current protective function.

The circuit shown in FIG. 3 has a similar disadvantage. In detail, since the output voltage of a source follower transistor never exceeds the drain voltage thereof, the range of the voltage signal narrows by an amount corresponding to the voltage drop across current detection resistor 5. That is, in those conventional amplifying circuits, the output voltage of the power transistor decreases due to a load current, so that the upper limit of the range of the voltage signal decreases accordingly.

Figure 4:
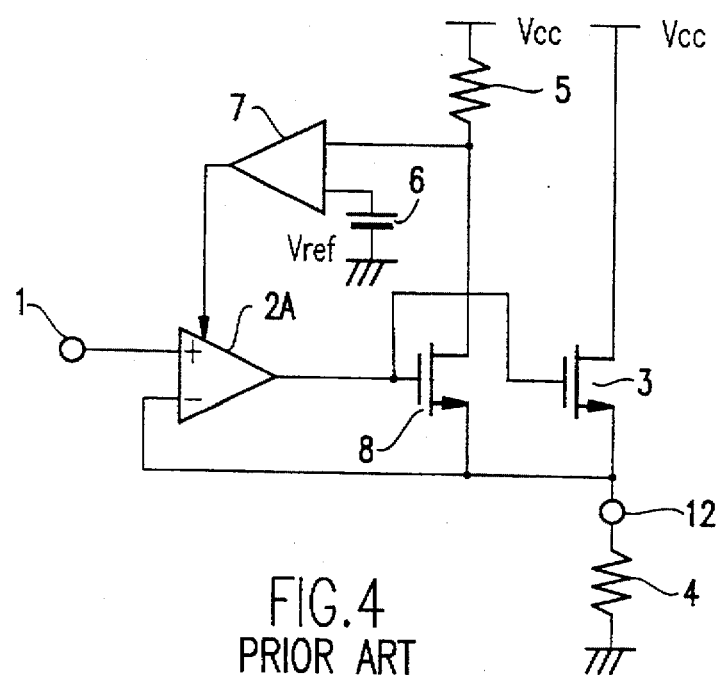
FIG. 4 is a circuit diagram showing another conventional amplifying circuit having an over-current protective function.

In the circuit shown in FIG. 4, since the drain voltage of transistor 8 decreases when the input voltage increases, the ratio between the current flowing through transistor 8 and the current flowing through transistor 3 does not correspond to the ratio of their device dimensions. Accordingly, a larger current flows through transistor 3 compared to the current of transistor 8 generally obtained from the dimensional ratio of transistor 3 to transistor 8. As a result, a desired current threshold for detecting an over-current state cannot be obtained. Some publications describe a circuit configuration in which a power bipolar transistor and a current detection bipolar transistor are separated from each other, similarly to the field effect transistors in the third conventional amplifying circuit. Also in this case, the base-to-emitter voltages of these transistors differ from each other, so that the current flowing through each transistor is not proportional to the device dimension of the emitter. That is, even when the voltage supplied to the current detection transistor reaches a predetermined threshold, it is uncertain whether the current flowing through the power transistor reaches a predetermined value. Accordingly, a desired accurate current threshold cannot be provided.

Figure 5:
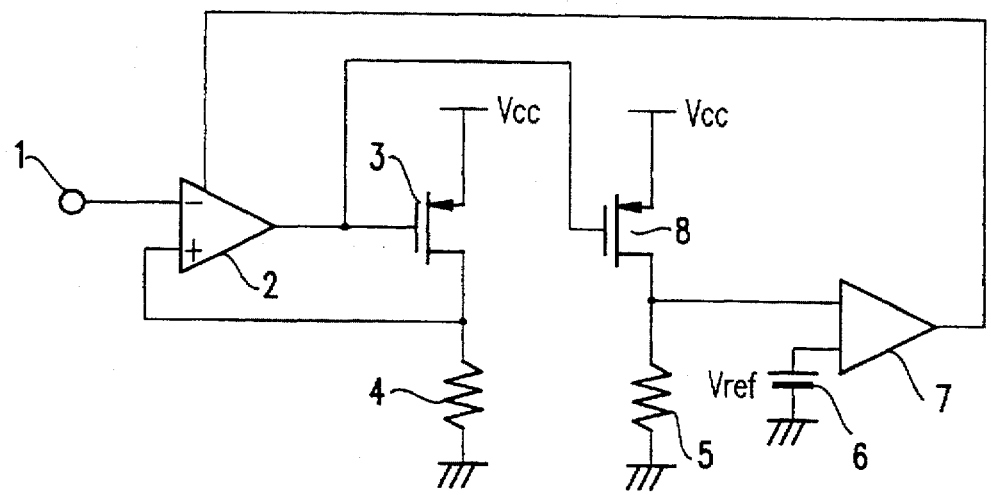
FIG. 5 is a circuit diagram showing an amplifying circuit having an over-current protective function according to a first embodiment of the present invention.

Now, the present invention will be described with reference to the accompanying drawings. FIG. 5 shows an amplifying circuit having an over-current protective function according to a first embodiment of the present invention. In this embodiment, a p-channel power transistor 3 in the output stage forms a common source configuration.

In FIG. 5, an operational amplifier 2 and power transistor 3 constitute an amplifying section for driving a load resistor 4, while a p-channel current detection transistor 8, a current detecting resistor 5, a reference voltage source 6 and a comparator 7 constitute an over-current protective section. Operational amplifier 2 has an inverting input connected to the input terminal 1 of the amplifying circuit, a non-inverting input connected to the drain of power transistor 3 and an output connected to the gate of power transistor 3. The source of power transistor 3 is connected to a power supply line Vcc, and the drain thereof is connected to load resistor 4 of the amplifying circuit.

Current detection transistor 8 has a source connected to the power supply line Vcc, a gate connected in common with the gate of power transistor 3, and a drain connected to the ground through current detection resistor 5 and to the first input of comparator 7, the second input of which is connected to a positive terminal of a reference voltage source 6. The output of comparator 7 is fed back to the control terminal of operational amplifier 2.

Figure 2:
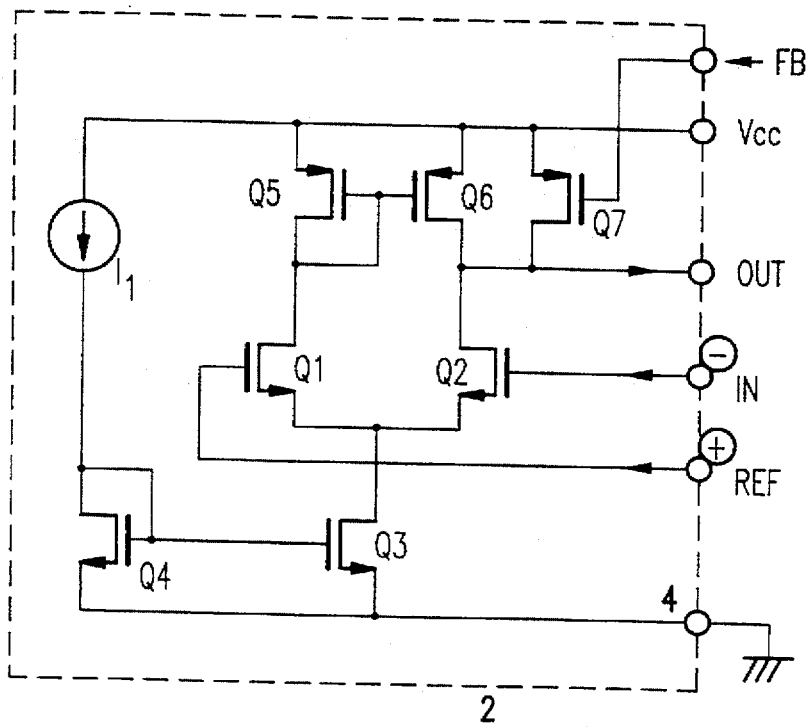
FIG. 2 is a circuit diagram showing an example of the operational amplifier in FIGS. 1 and 5.

The operational amplifier 2 has a circuit configuration such as shown in FIG. 2. The operational amplifier 2 is composed of transistors Q1–Q7 and a constant current source I1. An input signal IN and a reference voltage REF are supplied to the gates of differential transistors Q2 and Q1, respectively, to generate an output signal (OUT) at the drain of transistor Q2. Transistors Q5 and Q6 forming a current mirror constitute active loads for transistors Q1 and Q2, respectively, and transistor Q7 is connected in parallel with transistor Q6. The sources of the transistors Q1 and Q2 are connected together to the drain of a transistor Q3 acting as a constant current source. The gate of transistor Q3 is supplied with a constant voltage generated by a serial circuit of a constant current source I1 and a load transistor Q4, which forms a current mirror circuit together with transistor The gate of transistor Q7 is connected to a feedback terminal of the operational amplifier 2 for receiving a feedback signal (FB). If the gate of transistor Q7 is maintained positive and an input signal IN is raised with respect to the reference voltage REF, the currents flowing through transistors Q1 and Q2 are reduced and increased, respectively. As a result, the current flowing through transistor Q5 is reduced so as to raise the on-resistance transistor Q6, the load current of which is determined by transistor Q2. As a result, the output voltage OUT falls in proportion to the voltage rise of the input signal IN with respect to the reference voltage REF.

With the configuration of FIG. 5, the gate and source of power transistor 3 and the gate and source of current detection transistor 8 are connected together, respectively. In operation, the ratio between the current flowing through power transistor 3 and the current flowing through current detection transistor 8 is determined by the ratio between their device dimensions. Accordingly, the current flowing through current detection transistor 8 is proportional to the load current supplied to the load 4, as a result of which the voltage signal generated across current detection resistor 5 is exactly proportional to the load current.

The voltage signal is compared in comparator 7 with the reference voltage Vref. When the load current exceeds a predetermined threshold, the voltage drop across current detection resistor 5 rises above the reference voltage Vref, so that the output of comparator 7 is reversed. As a result, operational amplifier 2 receiving the output of comparator 7 raises the output of operational amplifier 2 by turning transistor Q7 in FIG. 2 on, thereby decreasing the load current for load resistor 4.

In the embodiment as described above, the source voltage of power transistor 3 does not depend on the load current, so that it has an advantage in that the range of the voltage signal does not narrow even in case of a high load current.

Figure 6:
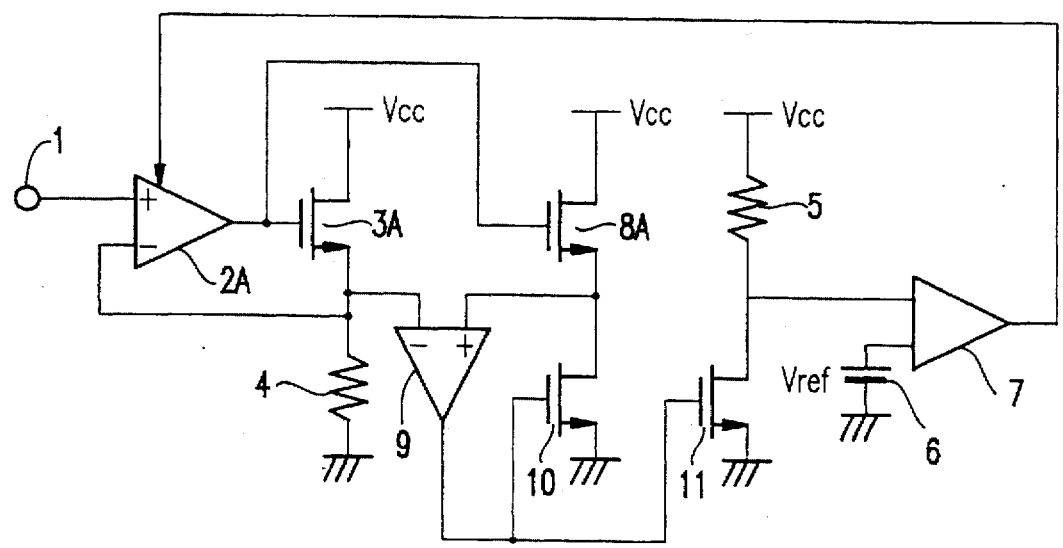
FIG. 6 is a circuit diagram showing an amplifying circuit having an over-current protective function according to a second embodiment of the present invention.

FIG. 6 shows an amplifying circuit having an over-current detective function according to a second embodiment of the present invention. The amplifying section for driving a load resistor 4 is similar to that in the first embodiment except for an n-channel power transistor 3A and the polarities and configuration of operational amplifier (first operational amplifier) 2A. Operational amplifier 2A receives input signal at the non-inverting input thereof and source output of power transistor 3A at the inverting input thereof. Operational amplifier 2A is similar to operational amplifier 2 of FIG. 2 except that p-channel transistor Q7 is connected between output terminal OUT and the ground in FIG. 2.

The over-current detective section in the present embodiment includes an n-channel current detection transistor 8A, a second operational amplifier 9, n-channel transistors 10 and 11, a current detection resistor 5, a reference voltage source 6, and a comparator 7. Second operational amplifier 9 has an inverting input receiving the source output of power transistor 3A, a non-inverting input receiving the source output of current detection transistor 8A and an output connected to the gates of transistors 10 and 11.

Transistor 10 has a source-drain current path connected in series with the source-drain current path of current detection transistor 8A while transistor 11 has a source-drain current path connected in series with current detection resistor 5. Comparator 7 has a first input connected to the drain of transistor 11, a second input connected to the positive terminal of reference voltage source 6, and an output connected to the control terminal of first operational amplifier 2A. Transistors 10 and 11 have the same dimension and the current flowing through transistor 10 is equal to the current flowing through transistor 8A, so that the current flowing through transistor 11 has the same magnitude as that of the current flowing through transistor 8A.

In operation, the source voltages of transistors 3A and 8A are maintained equal to each other by a feedback circuit formed by operational amplifier circuit 9 and transistor 10. Therefore, the ratio between the current flowing through load resistor 4 and the current flowing through transistor 8A is maintained exactly at the ratio of the device dimensions between transistor 3A and transistor 8A.

As a result, a voltage signal having a magnitude proportional to the load current is generated across current detection resistor 5. The voltage signal is compared with the reference voltage Vref in comparator 7. When the load current exceeds a predetermined threshold, the voltage drop across current detection resistor 5 decreases to a level below the reference voltage Vref, so that the output of comparator 7 is reversed. As a result, operational amplifier 2A grounds the gate of power transistor 3 so as to stop the load current.

In the amplifying circuit of the present embodiment, the source voltage of power transistor 3A does not depend on the load current because power transistor 3A and current detection transistor 8A are separated from each other in the amplifying circuit. As a result, the range of the output voltage of the amplifying section does not narrow even in the case of a high load current. In addition, the potentials at the drain, gate and source of power transistor 3A are the same as those at the drain, gate and source of current detection transistor 8A, so that exact threshold for Q3. detection of the over-current state can be obtained.

Since above embodiments are described only for examples, the present invention is not limited to such embodiments and it will be obvious for those skilled in the art that various modifications or alterations can be easily made based on the above embodiments within the scope of present invention.

What is claimed is:

1. An amplifying circuit comprising:

an amplifying section including a first amplifier having an input terminal for receiving an input signal, an output terminal for supplying a first signal and a control terminal for receiving a control signal to control the signal level of said first signal, and a power transistor, having a gate for receiving said first signal, a source connected to a power source line and a drain connected to a load, for supplying a load current to the load; and an over-current protective section including a current detection transistor, having a gate connected to the gate of said power transistor, a source connected to said power source line and a drain for supplying a second signal, and a comparator receiving a third signal corresponding to the magnitude of said second signal and a fourth signal having a constant voltage level, said comparator providing said control signal as the output thereof when said third signal exceeds said constant voltage level, said control signal controlling said load current to decrease.

2. An amplifying circuit as defined in claim 1 wherein the sources of said power transistor and said current detection transistor are connected together to a power supply line.

3. An amplifying circuit as defined in claim 2 wherein said power transistor and current detection transistor comprise p-channel transistors.

4. An amplifying circuit as defined in claim 3 wherein said third signal comprises said second signal.

5. An amplifying circuit as defined in claim 1 further comprising a feedback section for maintaining the potential of the source of said current detection transistor at the potential of the source of said power transistor, wherein the drains of said power transistor and current detection transistor are connected together to a power supply line.

6. An amplifying circuit comprising:

an amplifying section including a first amplifier having an input terminal for receiving an input signal, an output terminal for supplying a first signal and a control terminal for receiving a control signal to control the signal level of said first signal, and a power transistor, having a gate, a source and a drain, for receiving said first signal at the gate thereof to supply a load current to a load of said amplifying circuit;

an over-current protective section including a current detection transistor, having a gate connected to the gate of said power transistor, a source and drain having potentials substantially equal to the potentials of the source and drain, respectively, of said power transistor, for receiving said first signal to supply a second signal, and a comparator receiving a third signal corresponding to the magnitude of said second signal and a fourth signal having a constant voltage level, said comparator providing said control signal as the output thereof when said third signal exceeds said constant voltage level, said control signal controlling said load current to decrease; and a feedback section for maintaining the potential of the source of said current detection transistor at the potential of the source of said power transistor, wherein the drains of said power transistor and current detection transistor are connected together to a power supply line, said feedback section including a second amplifier having a first input connected to the source of said power transistor, a second input connected to the source of said current detection transistor and an output, and a first transistor connected in series with said current detection transistor and having a gate connected to the output of said second amplifier.

7. An amplifying circuit as defined in claim 6 further comprising a second transistor, having a gate and source connected to the gate and source, respectively, of said first transistor, said second transistor having a current detection resistor for supplying said third signal of said comparator.

8. An amplifying circuit comprising:

an amplifying section comprising:
  a first amplifier having an input terminal for receiving an input signal, an output terminal for supplying a first signal and a control terminal for receiving a control signal to control the signal level of said first signal, and
  a power transistor, having a gate, a source and a drain, for receiving said first signal at the gate thereof to supply a load current to a load of said amplifying circuit; and an over-current protective section comprising:
  a current detection transistor, having a gate connected to the gate of said power transistor, a source and drain biased at potentials substantially equal to the potentials of the source and drain, respectively, of said power transistor and providing a second signal responsive to said first signal, and
  a comparator referenced to a constant voltage level, said comparator providing said control signal as the output thereof responsive to said second signal, said control signal selectively decreasing said load current whenever said second signal exceeds said constant voltage level.

9. An amplifying circuit as in claim 8 wherein the sources of said power transistor and said current detection transistor are connected together to a power supply line.

10. An amplifying circuit as defined in claim 9 wherein said power transistor and said current detection transistor comprise p-channel transistors.

11. An amplifying circuit as defined in claim 8 wherein a third signal is provided responsive to said second signal, said third signal being received by said comparator and compared to said constant voltage level in said comparator to provide said control signal.

12. An amplifying circuit as in claim 11 further comprising a feedback section for maintaining the potential of the source of said current detection transistor at the potential of the source of said power transistor, wherein the drains of said power transistor and current detection transistor are connected together to a power supply line.

13. An amplifying circuit as in claim 12 wherein said feedback section further comprises:
  a second amplifier having a first input connected to the source of said power transistor, a second input connected to the source of said current detection transistor and an output; and,
  a first transistor connected in series with said current detection transistor and having a gate connected to the output of said second amplifier.

14. An amplifying circuit as in claim 13 further comprising a second transistor having its gate and source connected to a gate and source, respectively of said first transistor, said second transistor having a current detection resistor for supplying said third signal to said comparator.

* * * * *